(12) United States Patent
Luo et al.

(10) Patent No.: US 9,620,638 B1
(45) Date of Patent: Apr. 11, 2017

(54) KIND OF POWER TRI-GATE LDMOS

(71) Applicant: UNIVERSITY OF ELECTRONIC SCIENCE AND TECHNOLOGY OF CHINA, Chengdu (CN)

(72) Inventors: Xiaorong Luo, Chengdu (CN); Weiwei Ge, Chengdu (CN); Junfeng Wu, Chengdu (CN); Da Ma, Chengdu (CN); Mengshan Lv, Chengdu (CN); Linhua Huang, Chengdu (CN); Qing Liu, Chengdu (CN); Tao Sun, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/253,774

(22) Filed: Aug. 31, 2016

(30) Foreign Application Priority Data

Jul. 14, 2016 (CN) .......................... 2016 1 0554363

(51) Int. Cl.
  *H01L 29/78* (2006.01)
  *H01L 29/06* (2006.01)
  *H01L 29/423* (2006.01)

(52) U.S. Cl.
  CPC ...... *H01L 29/7816* (2013.01); *H01L 29/0696* (2013.01); *H01L 29/4238* (2013.01)

(58) Field of Classification Search
  CPC ............. H01L 29/7816; H01L 29/7835; H01L 29/66659; H01L 29/0696; H01L 29/4238; H01L 29/7834
  See application file for complete search history.

(56) References Cited

U.S. PATENT DOCUMENTS

2016/0141413 A1* 5/2016 Noh .................... H01L 29/7816
                                                          257/337

* cited by examiner

*Primary Examiner* — A. Sefer
*Assistant Examiner* — Benjamin Tzu-Hung Liu
(74) *Attorney, Agent, or Firm* — Matthias Scholl P.C.; Matthias Scholl

(57) ABSTRACT

A tri-gate laterally-diffused metal oxide semiconductor (LDMOS), including a substrate, a P-type semiconductor region, a P-type contact region, an N-type source region, a gate dielectric layer, an N-type drift region, a first isolation dielectric layer, an N-type drain region, and a second isolation dielectric layer. The P-type semiconductor region is disposed on one end of an upper surface of the substrate, and the N-type drift region is disposed on another end of the upper surface. The P-type semiconductor region contacts with the N-type drift region. The P-type contact region and the N-type source region are disposed on one side of the P-type semiconductor region which is away from the N-type drift region, and compared with the P-type contact region, the N-type source region is in the vicinity of the N-type drift region.

7 Claims, 9 Drawing Sheets

KIND OF POWER TRI-GATE LDMOS

CROSS-REFERENCE TO RELATED APPLICATIONS

Pursuant to 35 U.S.C. §119 and the Paris Convention Treaty, this application claims the foreign priority benefit of Chinese Patent Application No. 201610554363.9 filed Jul. 14, 2016, the contents of which, are incorporated herein by reference.

BACKGROUND OF THE INVENTION

Field of the Invention

The invention relates to a tri-gate laterally-diffused metal oxide semiconductor (LDMOS).

Description of the Related Art

Typical LDMOS has high channel resistance and high specific on-resistance, which adversely affect the working performance of the LDMOS.

SUMMARY OF THE INVENTION

In view of the above-described problems, it is one objective of the invention to provide a tri-gate laterally-diffused metal oxide semiconductor (LDMOS) which is based on the bulk silicon technology.

To achieve the above objective, in accordance with one embodiment of the invention, there is provided a tri-gate laterally-diffused metal oxide semiconductor (LDMOS), comprising a substrate, a P-type semiconductor region, a P-type contact region, a N-type source region, a gate dielectric layer, a N-type drift region, a first isolation dielectric layer, a N-type drain region, and a second isolation dielectric layer. The P-type semiconductor region is disposed on one end of an upper surface of the substrate, and the N-type drift region is disposed on another end of the upper surface of the substrate. The P-type semiconductor region contacts with the N-type drift region. The P-type contact region and the N-type source region are disposed on one side of the P-type semiconductor region which is far from the N-type drift region, and compared with the P-type contact region, the N-type source region is in the vicinity of the N-type drift region. Upper surfaces of the P-type contact region and the N-type source region are connected to source metal. The N-type drain region is disposed on one end of N-type drift region which is far from the P-type semiconductor region. An upper surface of the N-type drain region is connected to drain metal. The gate dielectric layer is disposed on an upper surface of the P-type semiconductor region. Along a lateral direction, one end of the gate dielectric layer contacts with the N-type source region, and another end of the gate dielectric layer contacts with the N-type drift region. Along a longitudinal direction, the gate dielectric layer is disposed on a central part of the P-type semiconductor region. Gate conductive material is disposed on an upper surface of the gate dielectric layer, and an upper surface of the gate conductive material is connected to gate metal. Along a longitudinal direction, two sides of the gate dielectric layer are provided with first slots. First slot walls and first slot bottoms are provided with the first isolation dielectric layer. The first slots are filled with the first conductive material and are surrounded by the first isolation dielectric layer. Along the lateral direction, one side of the first slots contacts with the N-type source region, and another side of first slots contacts with the N-type drift region. Along a vertical direction, a depth of the first slots is larger than a depth of the N-type source region, and is smaller than a depth of the P-type semiconductor region. The first slots are symmetrical along a longitudinal midline of the gate dielectric layer. Along the lateral direction, second slots are disposed between the first slots and the N-type drain region. Second slot walls and second slot bottoms are provided with the second isolation dielectric layer. Along the lateral direction, a width of the second isolation dielectric layer is increased from one side which is in the vicinity of the P-type semiconductor region to another side which is in the vicinity of the N-type drain region. The second slots are filled with the second conductive material, and are surrounded by the second isolation dielectric layer. Along the lateral direction, one side of the second slots contacts with the first slot, and another side of second slots contacts with the N-type drain region. The second isolation dielectric layer under a bottom of the second conductive material is thicker than the first isolation dielectric layer under a bottom of the first conductive material. The first conductive material is electrically connected to the gate metal. A lower surface of the N-type drain region is arranged lower than a lower surface of the second isolation dielectric layer. The lateral direction and the longitudinal direction are in the same horizontal plane and are perpendicular to each other.

In a class of this embodiment, along the lateral direction, a width of the N-type drift region is increased from one side which is in the vicinity of the P-type semi-conductor region to another side which is in the vicinity of the N-type drain region.

In a class of this embodiment, a doping concentration in the N-type drift region is increased from one side which is in the vicinity of the P-type semi-conductor region to another side which is in the vicinity of the N-type drain region.

In a class of this embodiment, a bottom surface of the second conductive material is ladder-shaped.

In a class of this embodiment, a doping concentration in the N-type drift region is decreased from two sides which are in the vicinity of the second slots to a longitudinal symmetry plane of the LDMOS.

In a class of this embodiment, strips of P-type dopant are embedded in a central part of the N-type drift region. Along the lateral direction, one side of the strips contacts with the P-type semiconductor region, and another side of the strips contacts with the N-type drain region.

In a class of this embodiment, the first slots and the second slots have different depths.

Advantages of the tri-gate LDMOS according to embodiments of the invention are summarized as follows:

The tri-gate structure increases the channel density and reduces the channel resistance, thereby decreasing the specific on-resistance. The second conductive material is freely connected to different electrodes. When the second conductive material is connected to a gate electrode, with a forward voltage, electron accumulation surfaces form on the side surface and the bottom surface of the second slot, thus building multi-dimensional low-resistance channels, and largely decreasing the specific on-resistance; with a reverse voltage, the depletion in drift region is assisted, thus increasing the doping concentration in the drift region, and decreasing the specific on-resistance. When the second conductive material is connected to a source electrode, because the gate-drain overlap is reduced, and the gate-drain capacitance of the LDMOS is decreased, the switching loss is reduced.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a tri-gate laterally-diffused metal oxide semiconductor (LDMOS) are described below. It should be noted that the following examples are intended to describe and not to limit the invention.

In the figures, the x axis is corresponding to the lateral direction; the y axis is corresponding to the vertical direction; and the z axis is corresponding to the longitudinal direction.

Example 1

Figure 1:
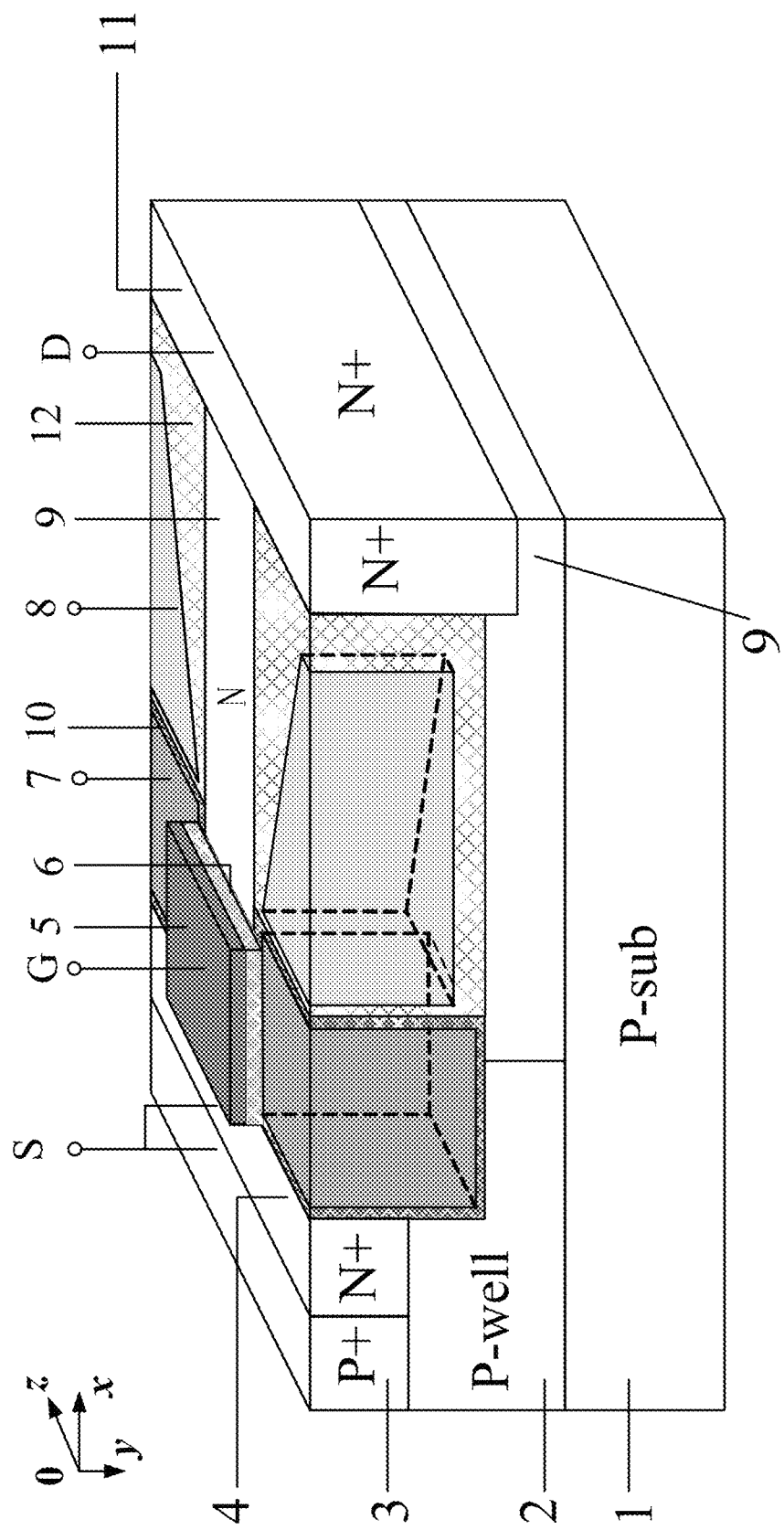
FIG. 1 is a schematic diagram of a tri-gate laterally-diffused metal oxide semiconductor (LDMOS) in Example 1.
Figure 2:
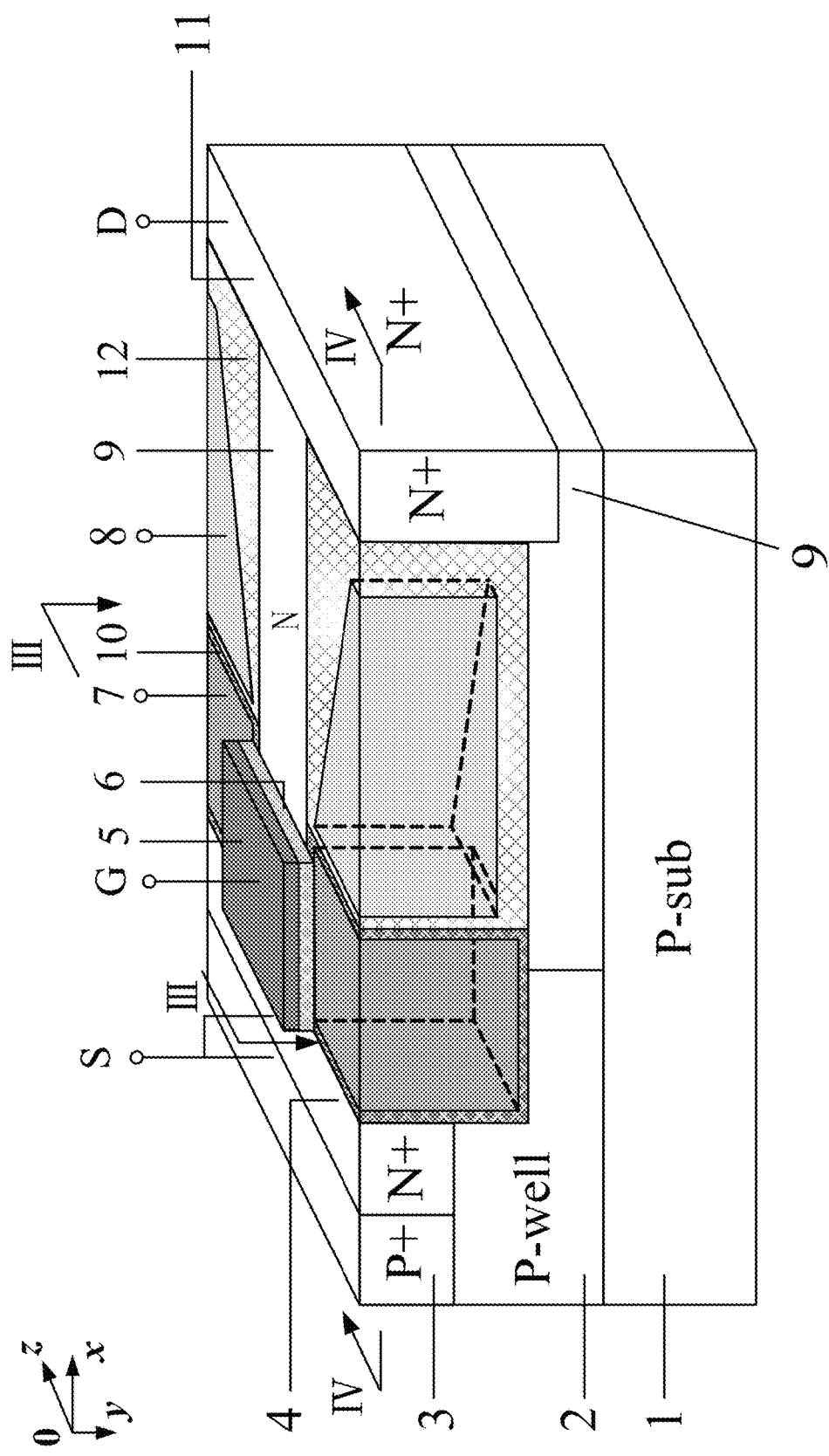
FIG. 2 is a schematic diagram of a tri-gate laterally-diffused metal oxide semiconductor (LDMOS) with auxiliary lines in Example 1.
Figure 3:
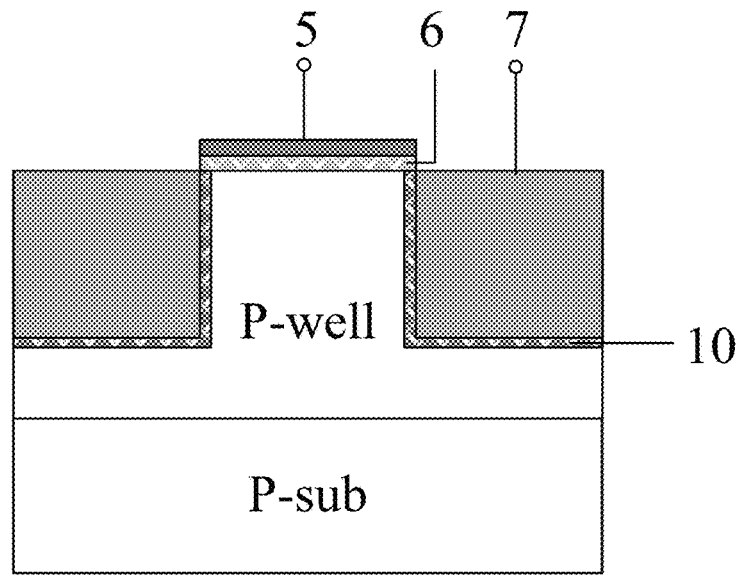
FIG. 3 a cross-sectional view taken from line in FIG. 2 in Example 1.
Figure 4:
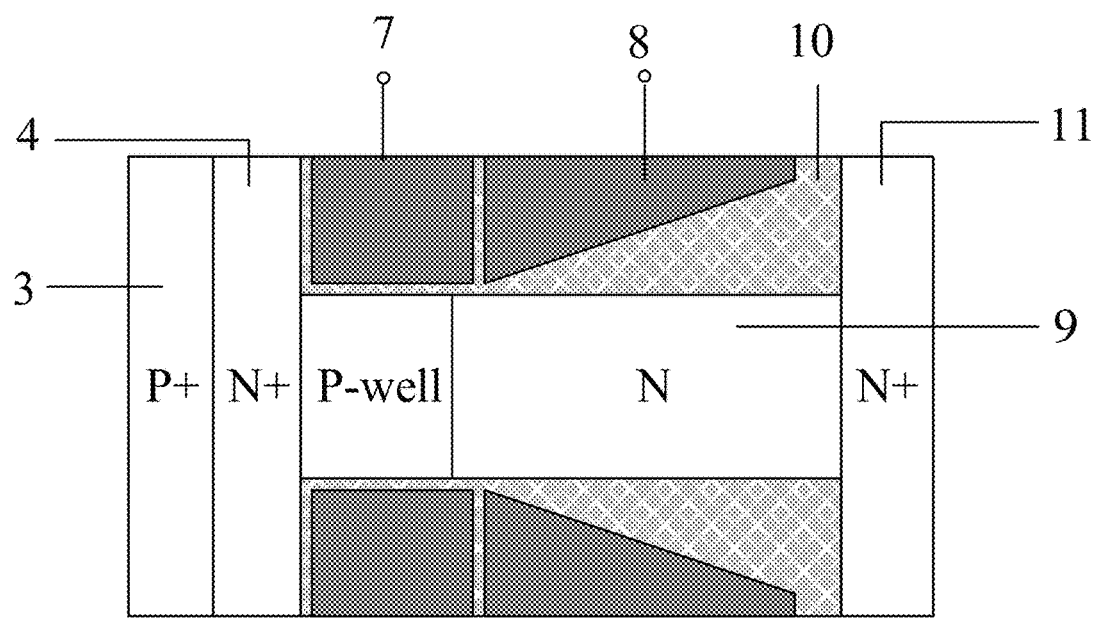
FIG. 4 is a cross-sectional view taken from line IV-IV in FIG. 2 in Example 1.

As shown in FIG. 1, a tri-gate laterally-diffused metal oxide semiconductor (LDMOS) comprises a substrate 1, a P-type semiconductor region 2, a P-type contact region 3, an N-type source region 4, a gate dielectric layer 6, an N-type drift region 9, a first isolation dielectric layer 10, an N-type drain region 11, and a second isolation dielectric layer 12. The P-type semiconductor region 2 is disposed on one end of an upper surface of the substrate 1, and the N-type drift region 9 is disposed on another end of the upper surface of the substrate. The P-type semiconductor region 2 contacts with the N-type drift region 9. The P-type contact region 3 and the N-type source region 4 are disposed on one side of the P-type semiconductor region 2 which is far from the N-type drift region 9, and compared with the P-type contact region, the N-type source region 4 is in the vicinity of the N-type drift region 9. Upper surfaces of the P-type contact region 3 and the N-type source region 4 are connected to the source metal. The N-type drain region 11 is disposed on one end of N-type drift region 9 which is far from the P-type semiconductor region 2. An upper surface of the N-type drain region 11 is connected to the drain metal. A gate dielectric layer 6 is disposed on an upper surface of the P-type semiconductor region 2. Along the lateral direction, one end of the gate dielectric layer 6 contacts with the N-type source region 4, and another end of the gate dielectric layer contacts with the N-type drift region 9. Along the longitudinal direction, the gate dielectric layer 6 is disposed on a central part of the P-type semiconductor region 2. The gate conductive material 5 is disposed on an upper surface of the gate dielectric layer 6, and an upper surface of the gate conductive material 5 is connected to the gate metal. Along the longitudinal direction, two sides of the gate dielectric layer 6 are provided with first slots. First slot walls and first slot bottoms are provided with the first isolation dielectric layer 10. The first slots are filled with the first conductive material 7 and are surrounded by the first isolation dielectric layer 10. Along the lateral direction, one side of the first slots contacts with the N-type source region 4, and another side of first slots contacts with the N-type drift region 9. Along a vertical direction, a depth of the first slots is larger than a depth of the N-type source region 4, and is smaller than a depth of the P-type semiconductor region 2. The first slots are symmetrical along a longitudinal midline of the gate dielectric layer 6. Along the lateral direction, second slots are disposed between the first slots and the N-type drain region 11. Second slot walls and second slot bottoms are provided with the second isolation dielectric layer 12. Along the lateral direction, a width of the second isolation dielectric layer 12 is increased from one side which is in the vicinity of the P-type semiconductor region 2 to another side which is in the vicinity of the N-type drain region 11. The second slots are filled with the second conductive material 8, and are surrounded by the second isolation dielectric layer 12. Along the lateral direction, one side of the second slots contacts with the first slots, and another side of second slots contacts with the N-type drain region 11. The second isolation dielectric layer 12 under a bottom of the second conductive material 8 is thicker than the first isolation dielectric layer 10 under a bottom of the first conductive material. The first conductive material 7 is electrically connected to the gate metal. A lower surface of the N-type drain region 11 is arranged lower than a lower surface of the second isolation dielectric layer 12. The lateral direction and the longitudinal direction are in the same horizontal plane and are perpendicular to each other.

The working principle of the invention is: 1. The conductive material in the first slots is connected to the gate conductive material, and a tri-gate structure is formed. The tri-gate structure increases the channel density and reduces the channel resistance, thereby decreasing the specific on-resistance. 2. The conductive material in the second slots is freely connected to different electrodes; a. when the conductive material is connected to a gate electrode, with a forward voltage, electron accumulation surfaces form on the side surfaces and the bottom surface of the second slots, thus building multi-dimensional low-resistance channels, and largely decreasing the specific on-resistance; with the reverse voltage, the depletion in the drift region is assisted, thus increasing the doping concentration in the drift region, and decreasing the specific on-resistance; b. when the conductive material is connected to a source electrode, because a gate-drain overlap is reduced, and the gate-drain capacitance of the LDMOS is decreased, the switching loss is reduced; with the reverse voltage, the depletion in the drift region is assisted, thus increasing the doping concentration in the drift region, and decreasing the specific on-resistance; c. the conductive material is electrically connected to different external electrodes for various effects. 3. The second isolation dielectric layer under the bottom of the second conductive material is thicker than the first isolation dielectric layer under the bottom of the first conductive material, thus the voltage endurance of the LDMOS is effectively improved. In addition, the voltage endurance of the LDMOS is further improved by increasing the width of the second isolation dielectric layer 12 from one side which is in the vicinity of the P-type semiconductor region 2 to another side which is in the vicinity of the N-type drain region 11. 4. The design of slot leakage reduces the flow paths of electrons when the LDMOS is in the on-state, thus the specific on-resistance is further decreased.

Example 2

Figure 5:
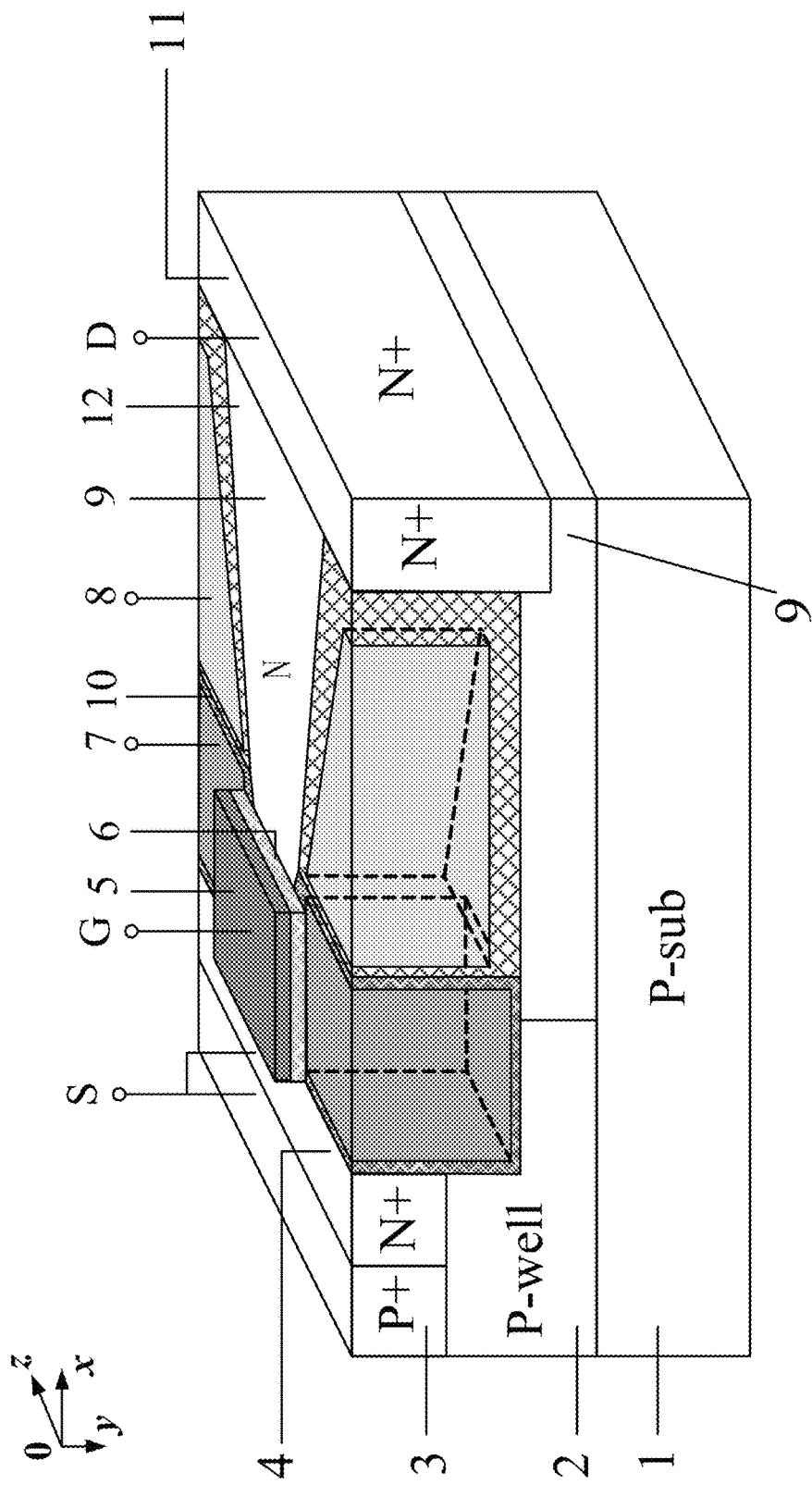
FIG. 5 is a schematic diagram of a tri-gate laterally-diffused metal oxide semiconductor (LDMOS) in Example 2.

As shown in FIG. 5, the example follows a basic structure in Example 1, except that the width of the N-type drift region 9 is increased from one side which is in the vicinity of the P-type semi-conductor region to another side which is in the vicinity of the N-type drain region. Thus the drift region 9 is configured to increase the conductive paths of majority carriers, and the specific on-resistance is further decreased.

Example 3

Figure 6:
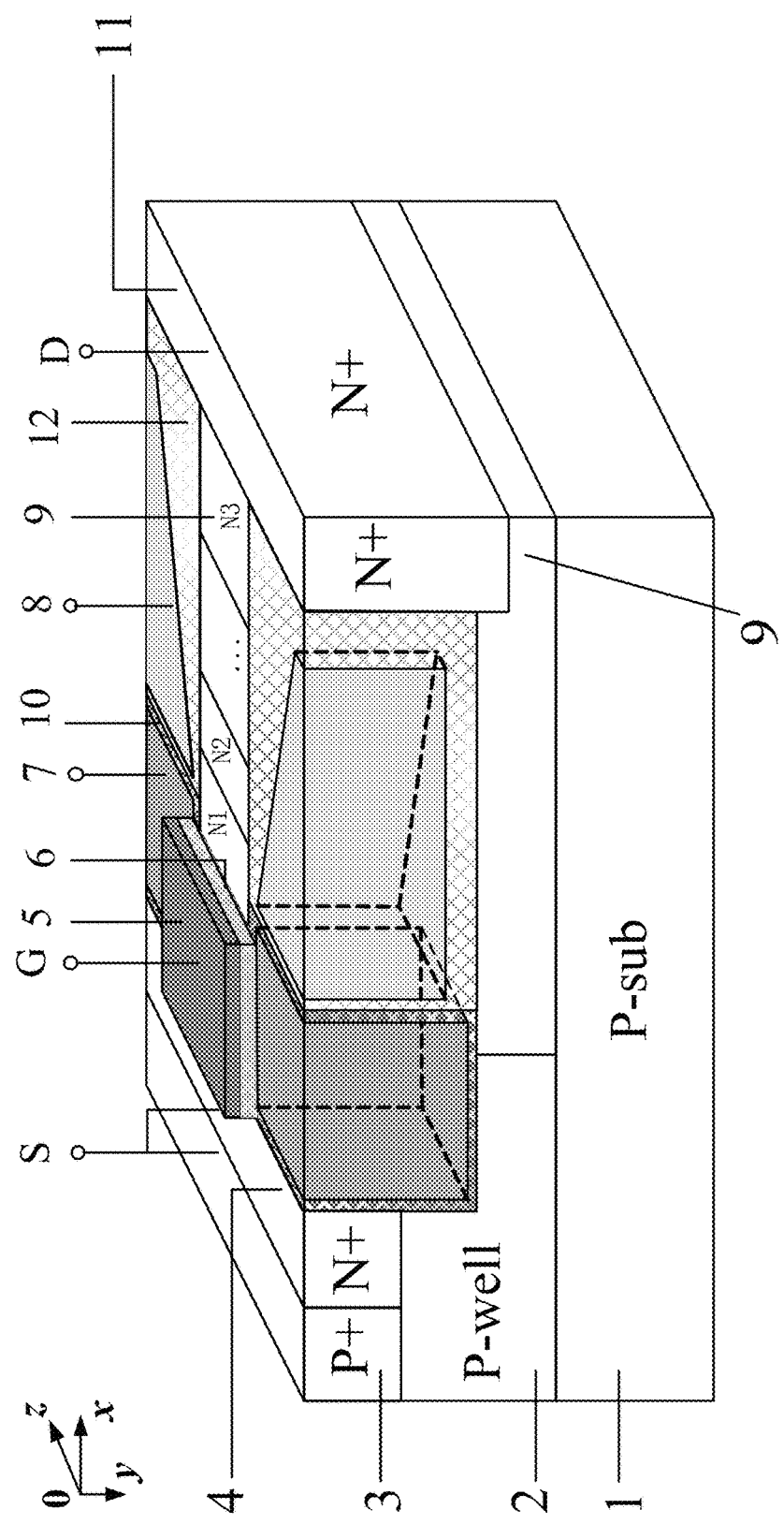
FIG. 6 is a schematic diagram of a tri-gate laterally-diffused metal oxide semiconductor (LDMOS) in Example 3.

As shown in FIG. 6, the example follows a basic structure in Example 1, except that along the lateral direction, a doping concentration in the N-type drift region 9 is increased from one side which is in the vicinity of the P-type semi-conductor region 2 to another side which is in the vicinity of the N-type drain region 11. The doping concentration which changes linearly regulates the electric field distribution in the drift region 9, and thus the breakdown voltage of the LDMOS is improved.

Example 4

Figure 7:
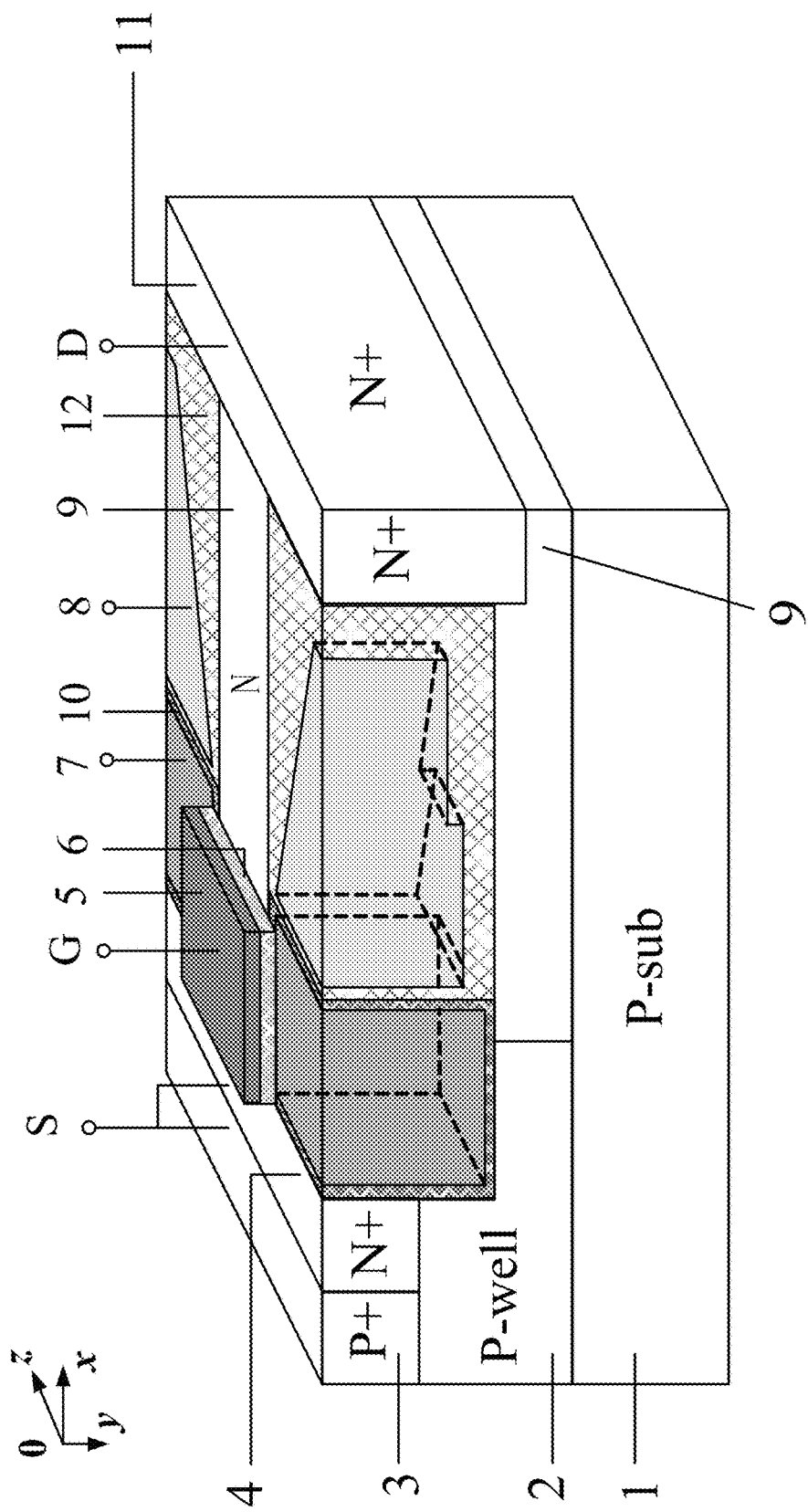
FIG. 7 is a schematic diagram of a tri-gate laterally-diffused metal oxide semiconductor (LDMOS) in Example 4.

As shown in FIG. 7, the example follows a basic structure in Example 1, except that a bottom surface of the second conductive material 8 is ladder-shaped, thus the electric field distribution in the drift region 9 is adjusted and the breakdown voltage of the LDMOS is improved.

Example 5

Figure 8:
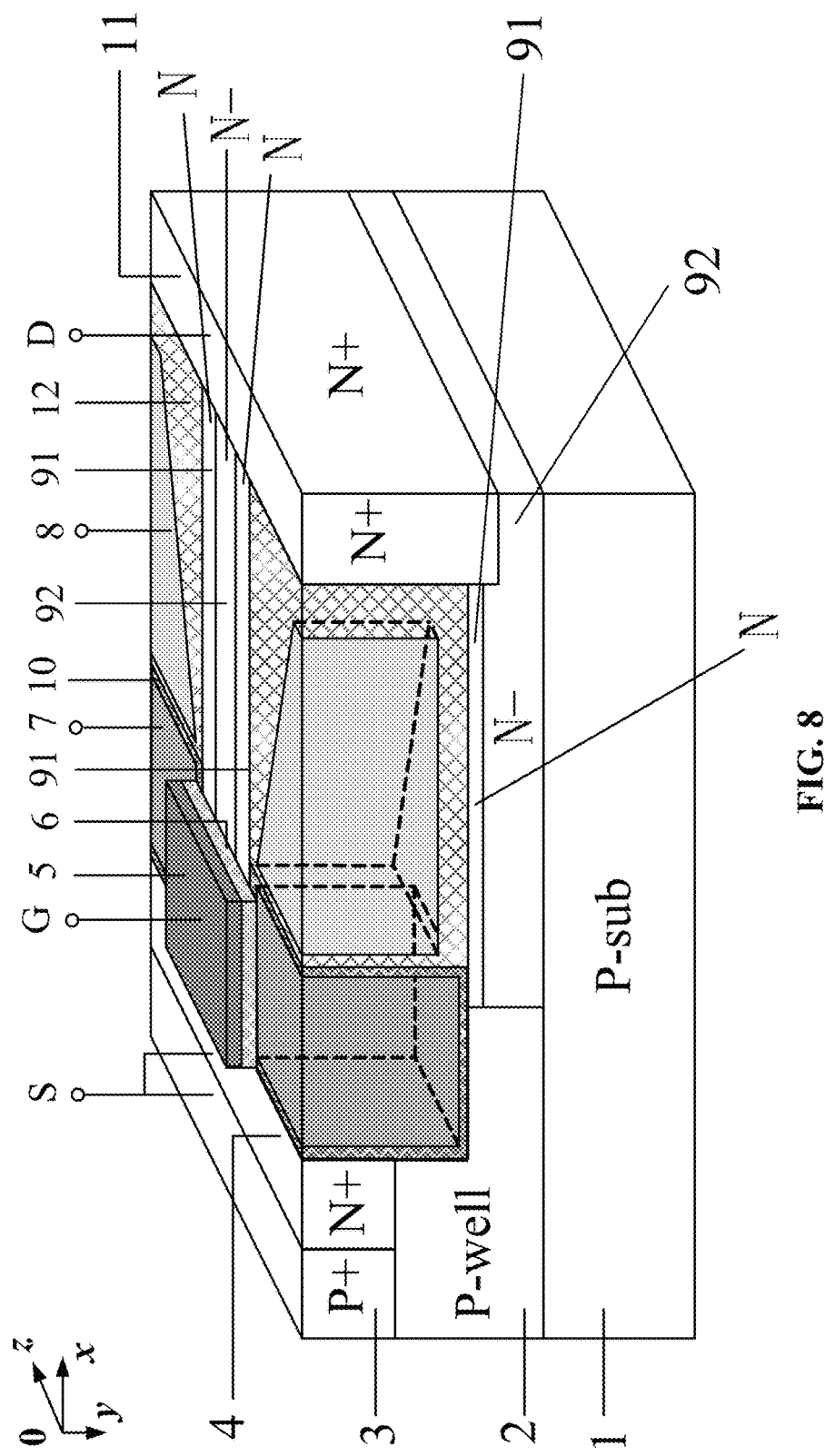
FIG. 8 is a schematic diagram of a tri-gate laterally-diffused metal oxide semiconductor (LDMOS) in Example 5.

As shown in FIG. 8, the example follows a basic structure in Example 1, except that a doping concentration in the N-type drift region 9 is decreased from two sides which are in the vicinity of the second slots to a longitudinal symmetry plane of the LDMOS. Therefore, the first region 91 having higher doping concentration on two sides of the drift region 9 are adapted to provide a low-resistance channel, and the specific on-resistance of the LDMOS is decreased; the second region 92 in the drift region 9 having lower doping concentration is adapted to improve the voltage endurance of the LDMOS.

Example 6

Figure 9:
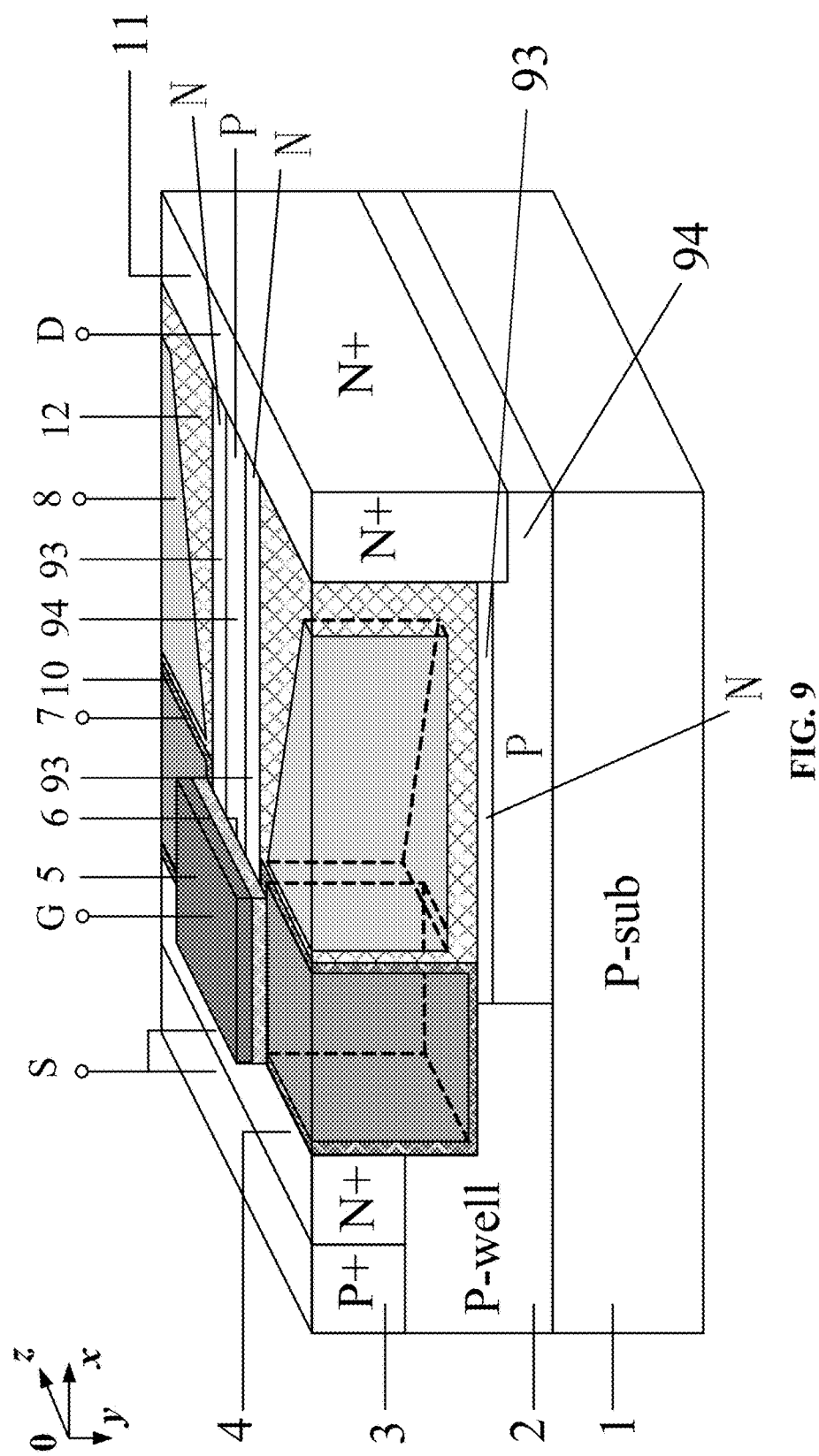
FIG. 9 is a schematic diagram of a tri-gate laterally-diffused metal oxide semiconductor (LDMOS) in Example 6.

As shown in FIG. 9, the example follows a basic structure in Example 1, except that strips 94 of P-type dopant are embedded in a central part of the N-type drift region 9. Along the lateral direction, one side of the strips 94 contacts with the P-type semiconductor region 2, and another side of the strips contacts with the N-type drain region 11. Strips 93 of N-type dopant and the strips 94 of P-type dopant form a super junction structure which is configured to assist the depletion and improves the doping concentration in the drift region, thereby decreasing the specific on-resistance of the LDMOS.

Example 7

Figure 10:
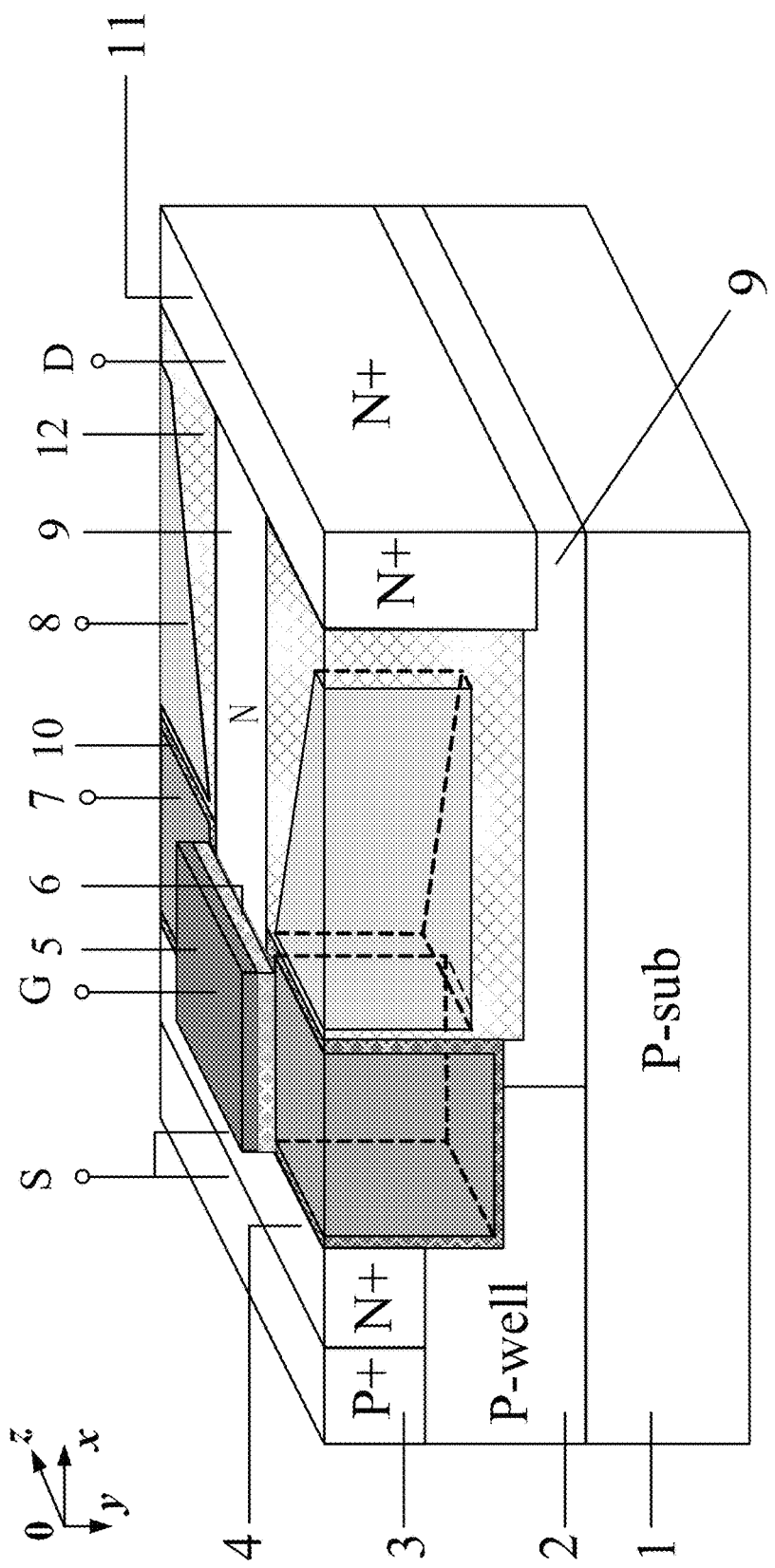
FIG. 10 is a schematic diagram of a tri-gate laterally-diffused metal oxide semiconductor (LDMOS) in Example 7.

As shown in FIG. 10, the example follows a basic structure in Example 1, except that the first slots and the second slots have different depths, thus the electric field distribution in the bottoms of slots is adjusted and the voltage endurance of the LDMOS is improved.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A tri-gate laterally-diffused metal oxide semiconductor (LDMOS), comprising:
    a substrate;
    a P-type semiconductor region;
    a P-type contact region;
    an N-type source region;
    a gate dielectric layer;
    an N-type drift region;
    a first isolation dielectric layer;
    an N-type drain region; and
    a second isolation dielectric layer;
wherein
    the P-type semiconductor region is disposed on one end of an upper surface of the substrate, and the N-type drift region is disposed on another end of the upper surface of the substrate; the P-type semiconductor region contacts with the N-type drift region;
    the P-type contact region and the N-type source region are disposed on one side of the P-type semiconductor region which is away from the N-type drift region, and compared with the P-type contact region, the N-type source region is in the vicinity of the N-type drift region;
    upper surfaces of the P-type contact region and the N-type source region are connected to source metal; the N-type drain region is disposed on one end of N-type drift region which is far from the P-type semiconductor region; an upper surface of the N-type drain region is connected to drain metal;
    the gate dielectric layer is disposed on an upper surface of the P-type semiconductor region; along a lateral direction, one end of the gate dielectric layer contacts with the N-type source region, and another end of the gate dielectric layer contacts with the N-type drift region; along a longitudinal direction, the gate dielectric layer is disposed on a central part of the P-type semiconductor region; gate conductive material is disposed on an upper surface of the gate dielectric layer, and an upper surface of the gate conductive material is connected to gate metal; along the longitudinal direction, two sides of the gate dielectric layer are provided with first slots; first slot walls and first slot bottoms are provided with the first isolation dielectric layer;
    the first slots are filled with first conductive material and are surrounded by the first isolation dielectric layer; along the lateral direction, one side of the first slots contacts with the N-type source region, and another side of first slots contacts with the N-type drift region;

along a vertical direction, a depth of the first slots is larger than a depth of the N-type source region, and is smaller than a depth of the P-type semiconductor region; the first slots are symmetrical along a longitudinal midline of the gate dielectric layer; along the lateral direction, second slots are disposed between the first slots and the N-type drain region; second slot walls and second slot bottoms are provided with the second isolation dielectric layer; along the lateral direction, a width of the second isolation dielectric layer is increased from one side which is in the vicinity of the P-type semiconductor region to another side which is in the vicinity of the N-type drain region;

the second slots are filled with the second conductive material, and are surrounded by the second isolation dielectric layer; along the lateral direction, one side of the second slots contacts with the first slots, and another side of second slots contacts with the N-type drain region; the second isolation dielectric layer under a bottom of the second conductive material is thicker than the first isolation dielectric layer under a bottom of the first conductive material; and the first conductive material is electrically connected to the gate metal; a lower surface of the N-type drain region is arranged lower than a lower surface of the second isolation dielectric layer; the lateral direction and the longitudinal direction are in the same horizontal plane and are perpendicular to each other.

2. The LDMOS of claim 1, wherein along the lateral direction, a width of the N-type drift region is increased from one side which is in the vicinity of the P-type semiconductor region to another side which is in the vicinity of the N-type drain region.

3. The LDMOS of claim 1, wherein a doping concentration in the N-type drift region is increased from one side which is in the vicinity of the P-type semi-conductor region to another side which is in the vicinity of the N-type drain region.

4. The LDMOS of claim 1, wherein a bottom surface of the second conductive material is ladder-shaped.

5. The LDMOS of claim 1, wherein a doping concentration in the N-type drift region is decreased from two sides which are in the vicinity of the second slots to a longitudinal symmetry plane of the LDMOS.

6. The LDMOS of claim 1, wherein strips of P-type dopant are embedded in a central part of the N-type drift region; along the lateral direction, one side of the strips contacts with the P-type semiconductor region, and another side of the strips contacts with the N-type drain region.

7. The LDMOS of claim 1, wherein the first slots and the second slots have different depths.

* * * * *